United States Patent
Lee et al.

(10) Patent No.: US 11,189,354 B2
(45) Date of Patent: Nov. 30, 2021

(54) NONVOLATILE MEMORY DEVICE WITH A MONITORING CELL IN A CELL STRING

(71) Applicant: SAMSUNG ELECTRONICS CO., LTD., Suwon-si (KR)

(72) Inventors: Kwang Woo Lee, Seoul (KR); Chan Ha Kim, Hwaseong-si (KR); Hee Won Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/826,558

(22) Filed: Mar. 23, 2020

(65) Prior Publication Data

US 2021/0057033 A1 Feb. 25, 2021

(30) Foreign Application Priority Data

Aug. 20, 2019 (KR) .................. 10-2019-0101486

(51) Int. Cl.
*G11C 16/34* (2006.01)
*G11C 16/08* (2006.01)
*G11C 16/14* (2006.01)
*G11C 16/26* (2006.01)

(52) U.S. Cl.
CPC .......... *G11C 16/3495* (2013.01); *G11C 16/08* (2013.01); *G11C 16/14* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 7,508,712 B2 | 3/2009 | Iwai | |
| 8,930,778 B2 | 1/2015 | Cohen | |
| 9,570,198 B2 | 2/2017 | Bellorado et al. | |
| 9,653,176 B2 | 5/2017 | Cai et al. | |
| 9,741,444 B2 | 8/2017 | Reusswig et al. | |
| 9,910,749 B2 | 3/2018 | Yang et al. | |
| 10,026,488 B2 | 7/2018 | Reusswig et al. | |
| 10,049,755 B2 | 8/2018 | Lee et al. | |
| 2009/0147581 A1* | 6/2009 | Isobe | G11C 11/5621 365/185.09 |

(Continued)

OTHER PUBLICATIONS

Communication dated Sep. 29, 2020 issued by the European Intellectual Property Office in counterpart European Application No. 20172053.9.

*Primary Examiner* — J. H. Hur
(74) *Attorney, Agent, or Firm* — Sughrue Mion, PLLC

(57) ABSTRACT

A nonvolatile memory device capable of minimizing monitoring overhead associated with read disturb is provided. The nonvolatile memory device includes a memory cell array which includes a first cell string comprising a plurality of memory cells connected in series, wherein the plurality of memory cells includes a first monitoring cell, a first memory cell, and a second memory cell, and a row decoder which provides a first read voltage to the first memory cell and a first monitoring voltage to the first monitoring cell when reading the first memory cell among the memory cells and provides the first read voltage to the second memory cell and a second monitoring voltage different from the first monitoring voltage to the first monitoring cell when reading the second memory cell.

19 Claims, 14 Drawing Sheets

(56) References Cited

U.S. PATENT DOCUMENTS

| | | | |
|---|---|---|---|
| 2009/0238003 A1* | 9/2009 | Namiki | G11C 16/3454 |
| | | | 365/185.17 |
| 2011/0075483 A1* | 3/2011 | Morikado | G11C 16/04 |
| | | | 365/185.11 |
| 2011/0075484 A1 | 3/2011 | Lee et al. | |
| 2012/0163096 A1* | 6/2012 | Futatsuyama | G11C 16/26 |
| | | | 365/185.22 |
| 2012/0307561 A1* | 12/2012 | Joo | G11C 16/10 |
| | | | 365/185.17 |
| 2017/0286288 A1 | 10/2017 | Higgins et al. | |
| 2018/0151234 A1 | 5/2018 | Cho | |
| 2019/0130983 A1 | 5/2019 | Singidi et al. | |

* cited by examiner

NONVOLATILE MEMORY DEVICE WITH A MONITORING CELL IN A CELL STRING

CROSS REFERENCE TO RELATED APPLICATIONS

This application claims priority from Korean Patent Application No. 10-2019-0101486, filed on Aug. 20, 2019 in the Korean Intellectual Property Office, the disclosure of which is incorporated herein in its entirety.

BACKGROUND

1. Technical Field

The disclosure relates to a nonvolatile memory device.

2. Description of the Related Art

A flash memory is a nonvolatile memory that can retain stored data even when power supply is interrupted. Recently, storage devices including flash memories such as embedded multimedia cards (eMMCs), universal flash storage (UFS), solid state drives (SSDs), and memory cards are widely used. Storage devices are useful for storing or moving large amounts of data.

Repeated read operations of a NAND flash memory device may cause read disturb, in which a memory cell that is an on cell is recognized as an off cell. During a read operation, when an unselect read voltage Vread is applied to a word line connected to a memory cell which is an on cell, electrons are introduced little by little into a trap layer of the on cell. "Vread" may be referred to as a "pass voltage." As the introduced electrons accumulate in the trap layer, the on cell may be recognized as an off cell.

To monitor the read disturb, a plurality of word lines showing weak characteristics during a read operation may all be monitored. However, this method may inevitably increase monitoring overhead as the number of the word lines showing weak characteristics increases.

SUMMARY

Aspects of the disclosure provide a nonvolatile memory device capable of minimizing monitoring overhead associated with read disturb.

However, aspects of the disclosure are not restricted to the one set forth herein. The above and other aspects of the disclosure will become more apparent to one of ordinary skill in the art to which the disclosure pertains by referencing the detailed description of the disclosure given below.

Provided herein is a nonvolatile memory device including: a memory cell array, wherein the memory cell array includes a first cell string, the first cell string includes a plurality of memory cells connected in series, and wherein the plurality of memory cells includes a first monitoring cell, a first memory cell, and a second memory cell; and a row decoder, wherein the row decoder is configured to: provide a first read voltage to the first memory cell and a first monitoring voltage to the first monitoring cell when reading the first memory cell, and provide the first read voltage to the second memory cell and a second monitoring voltage different from the first monitoring voltage to the first monitoring cell when reading the second memory cell.

Also provided herein is another nonvolatile memory device including: a memory cell array, wherein the memory cell array includes a plurality of memory blocks, each memory block of the plurality of memory blocks includes a plurality of cell strings, each cell string of the plurality of cell strings includes a plurality of memory cells and a monitoring cell, a first memory block of the plurality of memory blocks includes a first plurality of cell strings, the first plurality of cell strings includes a first cell string, and the first cell string includes a selected memory cell, unselected memory cells, and a first monitoring cell; and a row decoder configured to: provide, during a read operation, a first read voltage to the selected memory cell, a second read voltage to the unselected memory cells, and a monitoring voltage to the first monitoring cell, wherein the row decoder is further configured to adjust the monitoring voltage according to at least one of: characteristics of the selected memory cell, characteristics of an unselected memory cell adjacent to the selected memory cell in the first cell string, and characteristics of the first memory block.

Provided herein is yet another nonvolatile memory device including: a memory cell array, wherein the memory cell array includes a cell string, the cell string includes a first memory cell, a plurality of memory cells connected in series, a monitoring cell, a string select element, and a ground select element, wherein the monitoring cell is located between the string select element and the plurality of memory cells or between the ground select element and the plurality of memory cells, and the cell string includes a selected memory cell, unselected memory cells, and a first monitoring cell; and a row decoder, wherein the row decoder is configured to provide voltages to the plurality of memory cells, the monitoring cell, the string select element, and the ground select element, wherein the row decoder is further configured to: provide, when reading the first memory cell, a first read voltage to the first memory cell, a second read voltage to a first unselected memory cell spaced apart from the first memory cell, a third read voltage to an unselected memory cell adjacent to the first memory cell and a first monitoring voltage to the monitoring cell, provide, when reading a second memory cell, the first read voltage to the second memory cell, the second read voltage to a second unselected memory cell spaced apart from the second memory cell, the third read voltage to a third unselected memory cell adjacent to the second memory cell and a second monitoring voltage different from the first monitoring voltage to the monitoring cell, wherein the third read voltage is greater than the second read voltage, the second read voltage is greater than the first read voltage, the first monitoring voltage and the second monitoring voltage are greater than the second read voltage, wherein the nonvolatile memory device is configured to determine whether to make a reclaim request based on whether the monitoring cell is deteriorated.

Also provided herein is a method for memory cell deterioration detection, the method including: identifying a first weak memory cell in a cell string; identifying a non-weak memory cell, wherein the non-weak memory cell is a neighbor to the first weak memory cell in the cell string; identifying a second weak memory cell in the cell string; designating the second weak memory cell as a monitoring cell; when a first read operation reads the non-weak memory cell: applying an elevated pass voltage to the monitoring cell; when a second read operation reads the first weak memory cell: applying a non-elevated pass voltage to the monitoring cell; when a count of read operations exceeds a threshold: checking the monitoring cell for deterioration; based on the checking, when the monitoring cell has deteriorated: performing a reclaim operation of the cell string;

and based on the checking, when the monitoring cell has not deteriorated: not performing the reclaim operation of the cell string.

According to an aspect of the disclosure, there is provided a nonvolatile memory device comprising a memory cell array which comprises a first cell string comprising a plurality of memory cells connected in series and a first monitoring cell, and a row decoder which provides a first read voltage to a first memory cell and a first monitoring voltage to the first monitoring cell when reading the first memory cell among the memory cells and provides the first read voltage to a second memory cell and a second monitoring voltage different from the first monitoring voltage to the first monitoring cell when reading the second memory cell different from the first memory cell among the memory cells.

According to another aspect of the disclosure, there is provided a nonvolatile memory device comprising a memory cell array which comprises a plurality of memory blocks, wherein each of the memory blocks comprises a plurality of cell strings, wherein each of the cell strings comprises a plurality of memory cells and a monitoring cell, and a row decoder which provides a first read voltage to a selected memory cell among the memory cells, a second read voltage to unselected memory cells, and a monitoring voltage to the monitoring cell during a read operation, wherein the monitoring voltage is adjusted according to at least one of characteristics of the selected memory cell, characteristics of the unselected memory cell adjacent to the selected memory cell, and characteristics of a memory block comprising the selected memory cell.

According to another aspect of the disclosure, there is provided a nonvolatile memory device comprising a memory cell array which comprises a cell string comprising a plurality of memory cells connected in series, a monitoring cell, a string select element, and a ground select element, and a row decoder which provides voltages to the memory cells, the monitoring cell, the string select element, and the ground select element, wherein the monitoring cell is located between the string select element and the memory cells or between the ground select element and the memory cells, and the row decoder provides a first read voltage to a first memory cell, a second read voltage to an unselected memory cell spaced apart from the first memory cell, a third read voltage to an unselected memory cell adjacent to the first memory cell and a first monitoring voltage to the first monitoring cell when reading the first memory cell among the memory cells, and provides the first read voltage to a second memory cell, the second read voltage to an unselected memory cell spaced apart from the second memory cell, the third read voltage to an unselected memory cell adjacent to the second memory cell and a second monitoring voltage different from the first monitoring voltage to the monitoring cell when reading the second memory cell different from the first memory cell among the memory cells, wherein the third read voltage is greater than the second read voltage, the second read voltage is greater than the first read voltage, the first monitoring voltage and the second monitoring voltage are greater than the second read voltage, and whether to make a reclaim request is determined according to whether the monitoring cell has deteriorated.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, various embodiments of the disclosure will be described with reference to the attached drawings.

Figure 1:
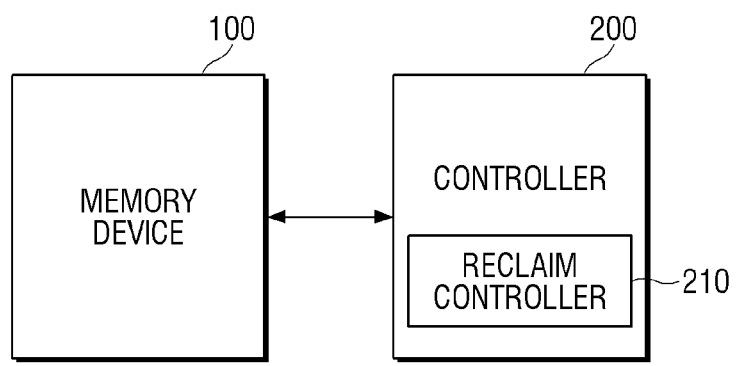
FIG. 1 is a block diagram of a storage device according to embodiments.

FIG. 1 is a block diagram of a storage device according to embodiments.

Referring to FIG. 1, the storage device according to the embodiments includes a memory device 100 and a memory controller 200.

The storage device may be implemented as, but is not limited to, a smart card, a secure digital (SD) card, a multimedia card (MMC), an embedded MMC (eMMC), an embedded multi-chip package (eMCP), a perfect page NAND (PPN), a universal flash storage (UFS), a universal serial bus (USB) flash drive, a solid state drive (SSD), or an embedded SSD (eSSD).

The memory device 100 may be, but is not limited to, a nonvolatile memory (e.g., a NAND flash memory)-based device.

The memory controller 200 controls the overall operation of the memory device 100. The memory controller 200 may interpret a command received from a host and control the operation (e.g., program, read, or erase operation) of the memory device 100 based on the interpretation result.

The memory controller 200 includes a reclaim controller 210. The reclaim controller 210 checks whether a monitoring cell (e.g., MC0 of FIG. 3A) of the memory device 100 has deteriorated and makes a reclaim request based on a result of the check. That is, depending on whether the monitoring cell has deteriorated, data stored in a memory block (or page) including the monitoring cell may be transferred to and stored in another memory block (or page).

Figure 2:
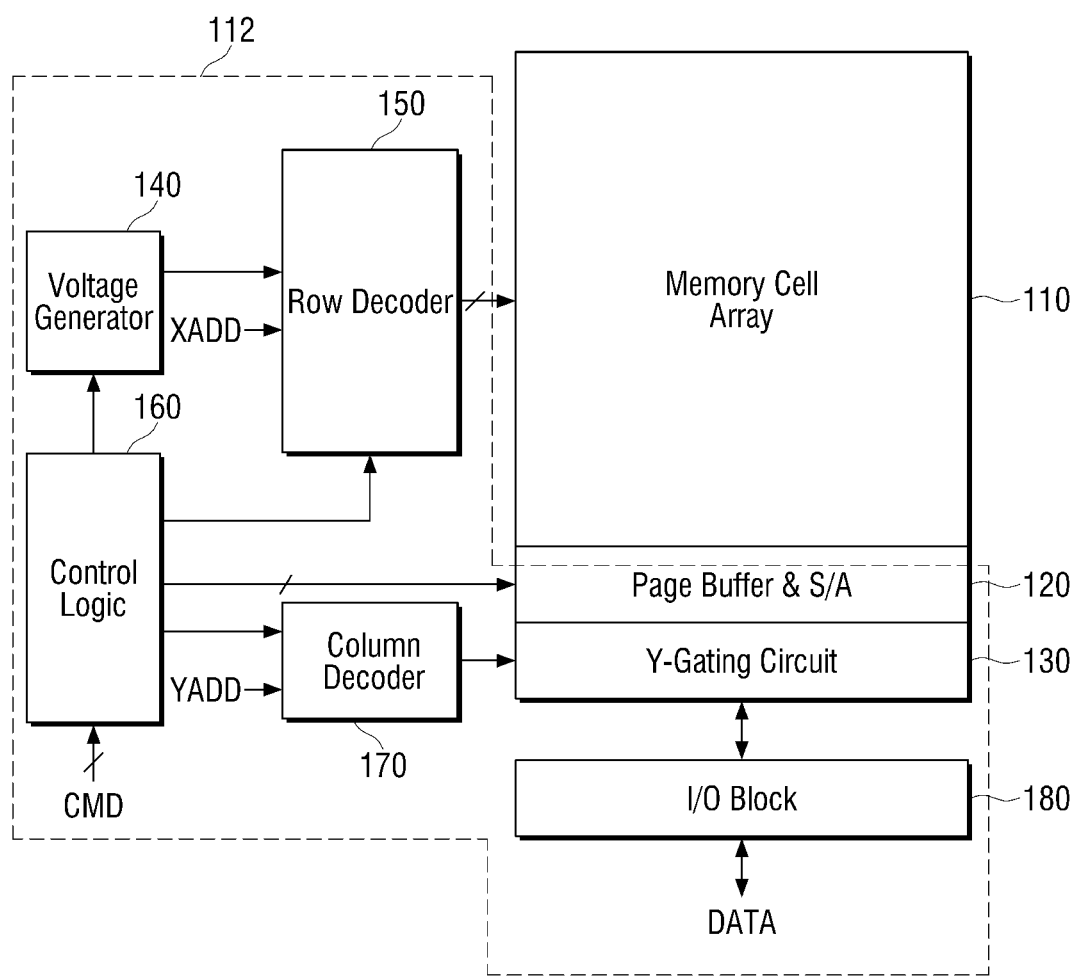
FIG. 2 is a block diagram of a nonvolatile memory device according to an embodiment.
Figure 3A:
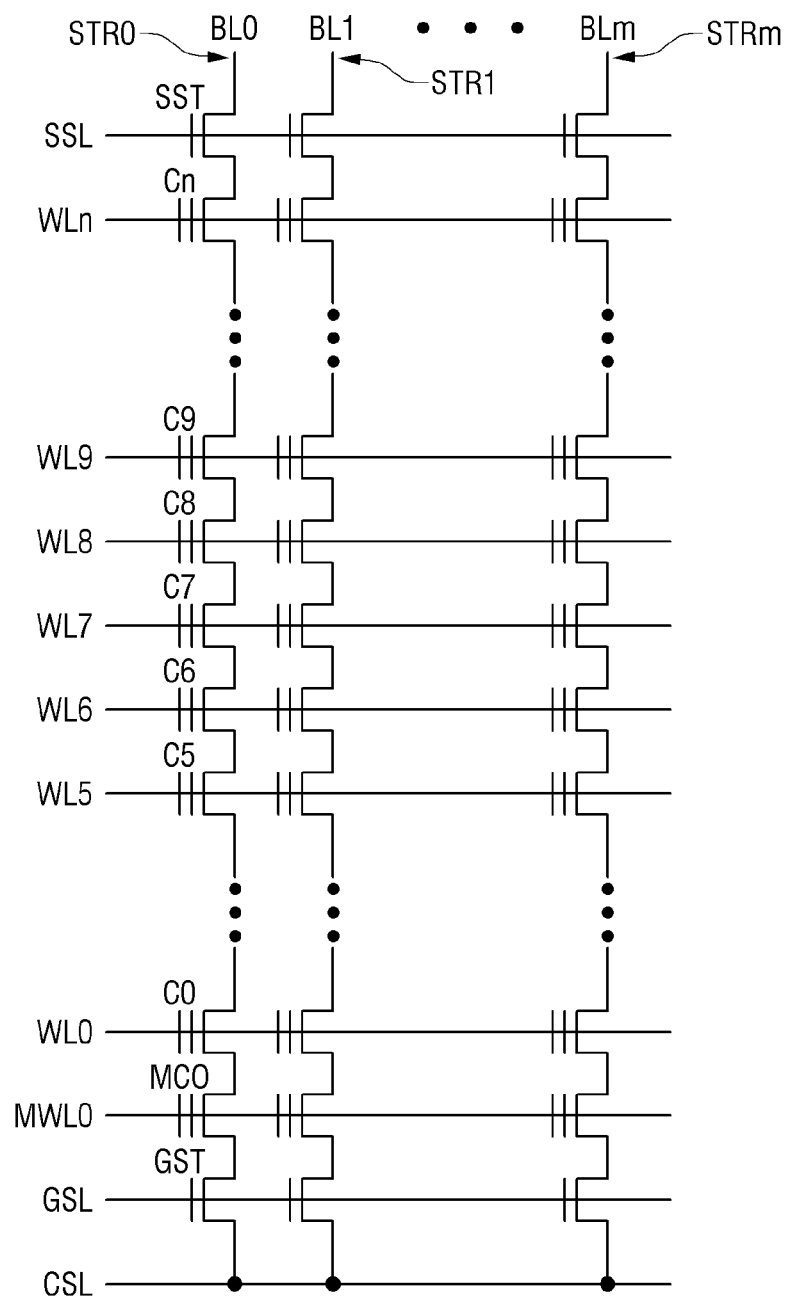
FIGS. 3A and 3B are circuit diagrams of a memory cell array of FIG. 2.
Figure 3B:
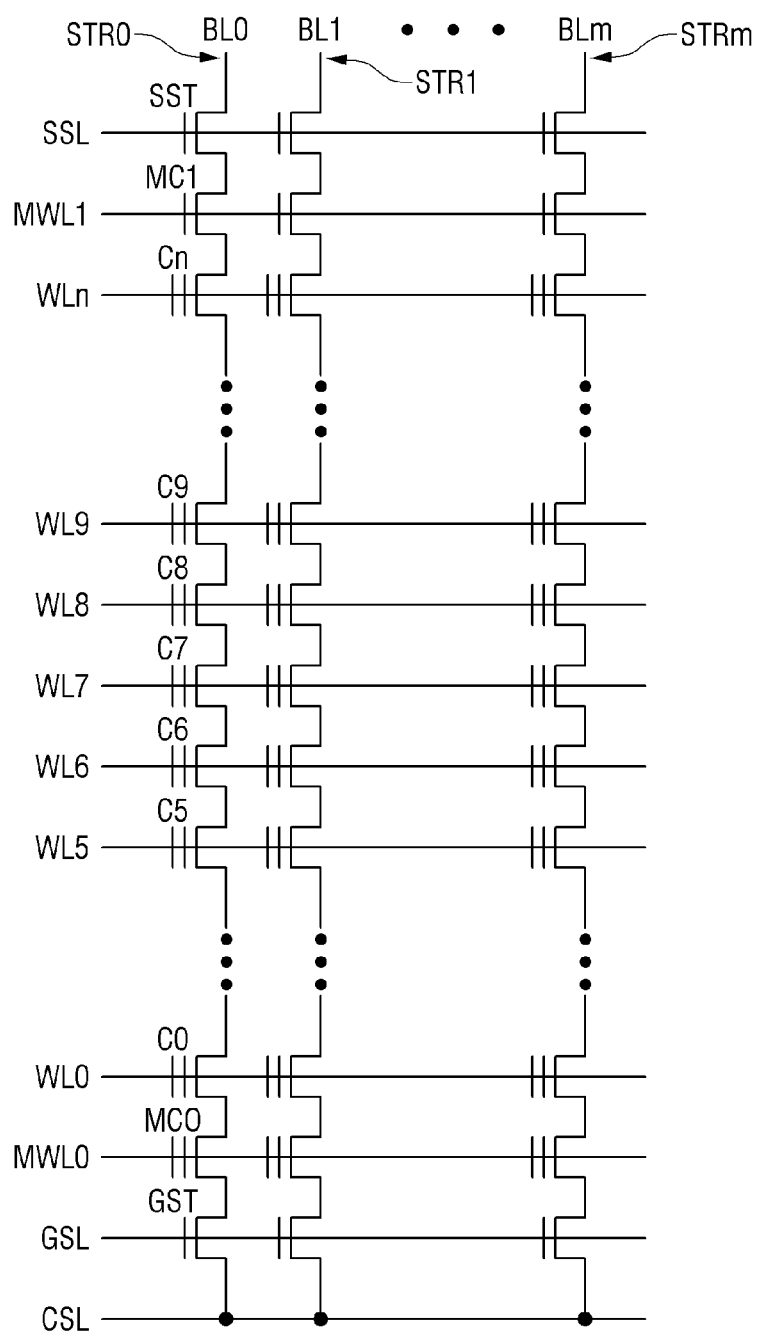

FIG. 2 is a block diagram of a nonvolatile memory device 100 according to embodiments. FIGS. 3A and 3B are circuit diagrams of a memory cell array 110 of FIG. 2. FIGS. 2, 3A and 3B will be described based on a NAND flash memory device, but embodiments are not limited to this case.

First, referring to FIG. 2, the memory device 100 includes the memory cell array 110 and an access circuit 112.

The memory cell array 110 may be a two-dimensional (2D) memory cell array or a three-dimensional (3D) memory cell array.

Referring to FIG. 3A, the memory cell array 110 may be a 2D memory cell array. In this case, the memory cell array 110 includes a plurality of cell strings STR0 to STRm. Each of the cell strings STR0 to STRm includes a plurality of memory cells C0 to Cn connected in series and a first monitoring cell MC0. In addition, each of the cell strings STR0 to STRm further includes a string select element SST and a ground select element GST. For example, the string select element SST may be a transistor having a drain connected to one of bit lines BL0 to BLm and a gate connected to a string select line SSL. The ground select element GST may be a transistor having a source connected to a common source line CSL and a gate connected to a ground select line GSL. The memory cells C0 to Cn respectively connected to a plurality of word lines WL0 to WLn and the first monitoring cell MC0 connected to a monitoring line MWL0 are connected in series between a source of the string select element SST and a drain of the ground select element GST. As mentioned above, in some embodiments, each memory cell includes a transistor. Each transistor has a source, gate and drain terminal. The gate of any transistor is connected to one of the word lines. The memory cell being turned "on" (a conductive path exists between the source and drain of the transistor) means that the corresponding transistor is placed into a conducting state by application of a read voltage on the gate of the transistor.

Although the first monitoring cell MC0 is disposed between the ground select element GST and a memory cell (e.g., C0) in FIG. 3A, embodiments are not limited to this case.

For example, as illustrated in FIG. 3B, a monitoring cell MC1 may be additionally disposed between the string select element SST and a memory cell (e.g., Cn). Alternatively, the monitoring cell MC1 may be disposed between the string select element SST and the memory cell (e.g., Cn), and the first monitoring cell MC0 may not be disposed between the ground select element GST and the memory cell (e.g., C0).

Alternatively, the first monitoring cell MC0 may be located between memory cells (e.g., C7 and C8). A memory cell exhibiting weak characteristics during a read operation may be designated as the first monitoring cell MC0, but embodiments are not limited to this case.

A case where the memory cell array 110 is a 3D memory cell array will be briefly described below. In the 3D memory cell array, an array of memory cells may be monolithically formed at one or more physical levels, and circuitry related to the operation of the memory cells may also be included. The term "monolithic" denotes that a layer at a level of an array is directly deposited on layers of an underlying level of the array. The 3D memory array may include a vertical NAND string which is vertically oriented such that at least one memory cell is located over other memory cells. In some embodiments, each NAND string is composed of a string of transistors; in some embodiments one memory cell is associated with one transistor. Each exemplary transistor has three terminals: source, gate and drain. The at least one memory cell may include a charge trap layer associated with the gate terminal. The 3D memory cell array may be implemented as a wafer stack, a chip stack, or a cell stack.

Referring again to FIG. 2, the access circuit 112 may include a voltage generator 140, a row decoder 150, a control logic 160, a column decoder 170, a page buffer and sense amplifier block 120, a Y-gating circuit 130, and an input/output (I/O) block 180.

The control logic 160 controls the overall operation of the access circuit 112 according to a command CMD received from the memory controller 200. For example, the control logic 160 may control the access circuit 112 to sense memory read state information during a memory read operation and provide read data to the memory controller 200.

The voltage generator 140 may generate a voltage required for an access operation according to control code generated by the control logic 160. The voltage generator 140 generate program voltages and program verification voltages needed to perform a program operation, generate read voltages needed to perform a read operation, and generate erase voltages and erase verification voltages needed to perform an erase operation. In addition, the voltage generator 140 provides voltages needed to perform each operation to the row decoder 150. The row decoder 150 decodes a row address XADD and selectively provides the read voltages, the program voltages, the program verification voltages, the erase voltages and the erase verification voltages to the memory cell array 110.

In particular, the read voltages generated by the voltage generator 140 may include a first read voltage (select read voltage) Vr, a second read voltage (unselect read voltage) Vread, a monitoring voltage Vm, a string select voltage, and a ground select voltage. The first read voltage Vr is a voltage provided to a memory cell to be read (i.e., a read target memory cell or a selected memory cell) through a selected word line. The second read voltage Vread is a voltage provided to a memory cell not to be read through an unselected word line. The monitoring voltage Vm is a voltage provided to a monitoring cell (e.g., MC0) whenever a read operation is performed on a cell string (e.g., STR0) including the monitoring cell (e.g., MC0). The string select voltage and the ground select voltage are voltages for turning on the string select element SST and the ground select element GST electrically connected to the memory cell to be read.

In addition, the voltage generator 140 may further generate a third read voltage (adjacent unselect read voltage) Vh. The third read voltage Vh is a voltage provided to an unselected memory cell immediately adjacent to the memory cell to be read through an adjacent unselected word line. When the third read voltage Vh is used, the second read voltage Vread is provided to an unselected memory cell spaced apart from the memory cell to be read.

The third read voltage Vh is higher than the second read voltage Vread.

The second read voltage Vread is higher than the first read voltage Vr.

The monitoring voltage Vm is also higher than the first read voltage Vr. The first monitoring cell MC0 may not receive the monitoring voltage Vm of a fixed level but may receive the monitoring voltage Vm adjusted according to at least one of characteristics of a selected memory cell (i.e., a memory cell to be read), characteristics of a memory cell adjacent to the selected memory cell, and characteristics of a memory block to which the selected memory cell belongs. For example, the voltage generator 140 may generate a plurality of monitoring voltages (e.g., Vm0 through Vm2) having different levels, and the row decoder 160 may select one (e.g., Vm2) of the monitoring voltages by considering the row address XADD (i.e., considering the above-described characteristics) and provide the selected monitoring voltage to the first monitoring cell MC0. Additionally, a level of the monitoring voltage Vm may be determined by further reflecting characteristics of a semiconductor chip including the selected memory cell.

A method of providing the read voltages (the first read voltage Vr, the second read voltage Vread, the third read voltage Vh and the monitoring voltage Vm) during a read operation will be described in detail later with reference to FIGS. 4 to 13.

The column decoder 170 decodes a column address YADD and provides a plurality of select signals to the Y-gating circuit 130 under the control of the control logic 160.

The page buffer and sense amplifier block 120 includes a plurality of page buffers PB. The page buffers PB are connected to a plurality of bit lines, respectively.

Each of the page buffers PB may operate as a driver for temporarily storing data read from the memory cell array 110 during a data read operation under the control of the control logic 160. In addition, each of the page buffers PB may operate as a sense amplifier capable of sensing and amplifying a voltage level of each of the bit lines during a read operation under the control of the control logic 160.

The Y-gating circuit 130 may control transmission of data DATA between the page buffer and sense amplifier block 120 and the I/O block 180 in response to the select signals received from the column decoder 170.

The I/O block 180 may transmit data DATA received from the outside to the Y-gating circuit 130 or data DATA output from the Y-gating circuit 130 to the memory controller 200 through a plurality of I/O pins (or a data bus).

Figure 4:
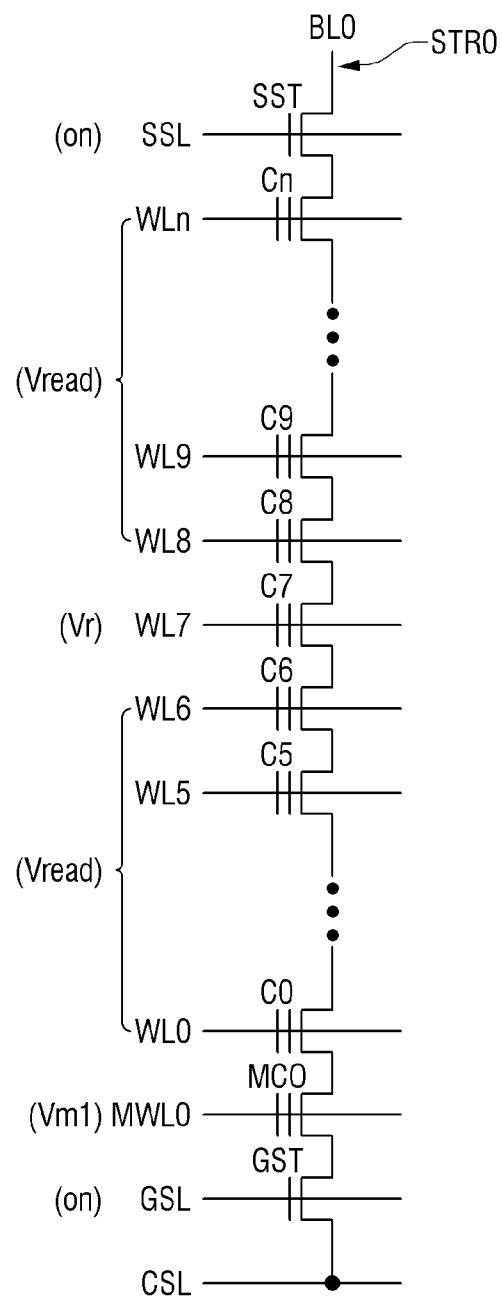
FIGS. 4 and 5 are diagrams for explaining a method of driving a nonvolatile memory device according to a first embodiment.
Figure 5:
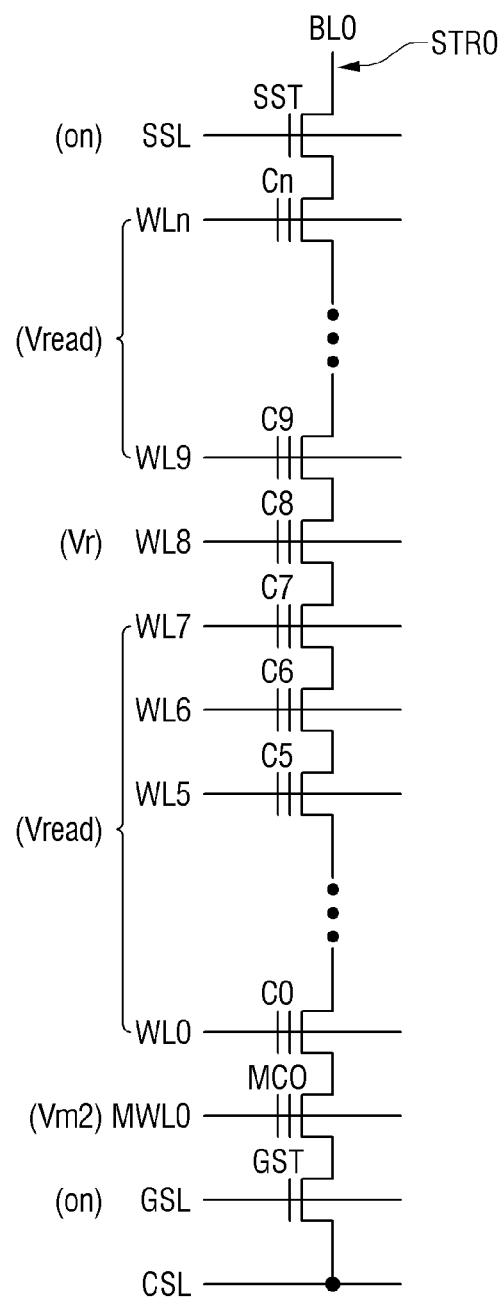
Figure 6:
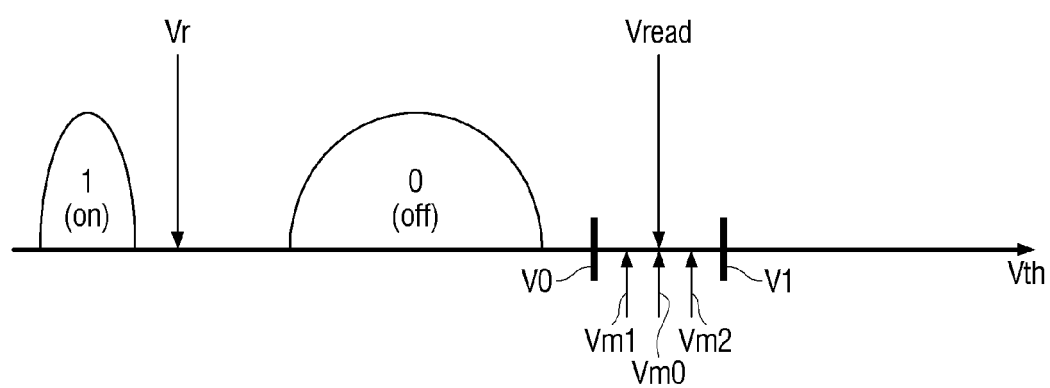
FIG. 6 is a diagram for explaining a level of a monitoring voltage used in the method of driving a nonvolatile memory device of FIGS. 4 and 5.

FIGS. 4 and 5 are diagrams for explaining a method of driving a nonvolatile memory device according to a first embodiment. FIG. 6 is a diagram for explaining a level of a monitoring voltage used in the method of driving a nonvolatile memory device of FIGS. 4 and 5. In particular, FIG. 6 is a diagram for explaining the level of the monitoring voltage when memory cells are single level cells (SLCs).

First, referring to FIG. 4, it is assumed that a first memory cell (e.g., C7) among a plurality of memory cells C0 to Cn is a selected memory cell (i.e., a memory cell to be read).

A string select voltage is applied to a string select line SSL to turn on a string select element SST, and a ground select voltage is applied to a ground select line GSL to turn on a ground select element GST.

A first read voltage (select read voltage) Vr is provided to the selected first memory cell C7 through a selected word line WL7, and a second read voltage (unselect read voltage) Vread is provided to unselected memory cells C0 to C6 and C8 to Cn in a cell string STR0 through unselected word lines WL0 to WL6 and WL8 to WLn.

A first monitoring voltage Vm1 is provided to a first monitoring cell MC0 through a monitoring line MWL0.

In FIG. 6, the x-axis is labelled "Vth." The x-axis corresponds to a threshold voltage applied to the gate terminal of an exemplary memory cell. At the threshold voltage an exemplary transistor realizing the memory cell conducts. Charge on the charge trap layer of the exemplary transistor gate changes the threshold voltage at which the transistor gate conducts. Thus, a "0" can be stored in the transistor by depositing no charge, and the cell will conduct when Vr is applied (leftmost portion of FIG. 6). A "1" can be stored in the transistor by depositing sufficient charge to move the threshold above Vr (the middle portion of FIG. 6, marked "0 (off)").

Different memory cells conduct at different threshold voltages. For a given memory cell, then, there is uncertainty as to the actual value of the threshold value. The bell-shaped functions in FIG. 6 indicate distributions of threshold value for many memory cells of a sample set. A peak in the distribution indicates the threshold value at which many memory cells of the sample set will conduct. When no charge is stored in the charge trap layer, there is a small range of threshold voltages shown by the narrow width of the bell-shaped function on the left of FIG. 6.

When charge is stored representing a logical "0" in the charge trap layer, there is a larger range of threshold voltages as shown by the distribution marked "0" in FIG. 6.

Here, referring to FIG. 6, the first read voltage Vr has a relatively low level, and the second read voltage Vread has a relatively high level.

As described above, the first read voltage Vr is greater than a threshold voltage of a memory cell (i.e., an on cell) having data '1' and less than a threshold voltage of a memory cell (i.e., an off cell) having data '0.' That is, when the first read voltage Vr is provided to the memory cell C7, whether the memory cell C7 is to be turned on or off is determined according to whether data stored in the memory cell C7 is 1 or 0.

The second read voltage Vread is higher than the threshold voltage of the memory cell (i.e., the off cell) having the data '0.' Therefore, the unselected memory cells C0 to C6 and C8 to Cn are turned on regardless of data stored in the unselected memory cells C0 to C6 and C8 to Cn. In this scenario, the amount of charge stored to place the memory cell in the off state ("0") keeps the exemplary transistor off when Vr is applied, but the stored charge will allow the exemplary transistor to conduct when Vread is applied.

Thus, the first monitoring voltage Vm1 is also higher than the threshold voltage of the memory cell (i.e., the off cell) having the data '0.' Therefore, the first monitoring cell MC0 is turned on by the first monitoring voltage Vm1.

Therefore, when the first read voltage Vr, the second read voltage Vread, and the first monitoring voltage Vm1 are applied during a read operation, a current may or may not flow from a bit line BL0 to a common source line CSL (i.e., a ground voltage) depending on whether the data stored in the memory cell C7 is 1 or 0.

Here, referring to FIG. 5, it is assumed that a second memory cell (e.g., C8) among the memory cells C0 to Cn is a selected memory cell (i.e., a memory cell to be read).

The first read voltage (select read voltage) Vr is provided to the selected first memory cell C8 through a selected word line WL8, and the second read voltage (unselect read voltage) Vread is provided to unselected memory cells C0 to C7 and C9 to Cn in the cell string STR0 through unselected word lines WL0 to WL7 and WL9 to WLn.

A second monitoring voltage Vm2 different from the first monitoring voltage Vm1 is provided to the first monitoring cell MC0 through the monitoring line MWL0.

Here, it is assumed that the first memory cell C7 is a memory cell (i.e., a weak cell) showing weak characteristics during a read operation, and the second memory cell C8 is not a weak cell. An example of a weak characteristic is a tail of a distribution which extends to the right in FIG. 6 of the "1" distribution. Also see FIG. 15. Such a tail corresponds to a weak memory cell conducting at value of Vth within the right side of the distribution marked "1" in FIG. 6. For example, 0.1%, 1% or 10% of the population of threshold values shown by the distribution correspond to weak cells.

Which cell in a memory cell array 110 is a weak cell or which memory block is a weak block may be identified through a test conducted during the manufacture of a nonvolatile memory device. Alternatively, which cell/block is a weak cell/weak block may be identified through the use of the nonvolatile memory device. The position of this weak cell/weak block is stored in the nonvolatile memory device (memory device 100). For example, the position of the weak cell/weak block may be stored in a control logic 160 or may be stored in a separate storage medium.

A level of a monitoring voltage Vm applied to the first monitoring cell MC0 may be adjusted according to a memory cell (C0 to Cn) to be read. In other words, the level of the monitoring voltage Vm may be adjusted according to a level of a voltage that a weak cell (e.g., the first memory cell C7) in the cell string STR0 receives during a read operation.

The level of the monitoring voltage Vm may be determined within a first voltage range of V0 to V1 including a first reference voltage Vm0 as illustrated in FIG. 6. Specifically, the first voltage range of V0 to V1 may include the first reference voltage Vm0 and extend to both sides from the first reference voltage Vm0. Here, a level of the first reference voltage Vm0 is determined based on a level of the second read voltage Vread. For example, the level of the first reference voltage Vm0 and the level of the second read voltage Vread may be substantially equal. Vm0 may be referred to as a non-elevated value.

When a weak cell (e.g., the first memory cell C7) is a memory cell to be read as in FIG. 4, the weak cell receives the first read voltage Vr having a relatively low level. Therefore, the first monitoring cell MC0 receives the first monitoring voltage Vm1 having a relatively low level.

On the other hand, when a memory cell (i.e., the second memory cell C8) which is not a weak cell is a memory cell to be read as in FIG. 5, the non-weak memory cell (the second memory cell C8) receives the first read voltage Vr, and the weak cell (i.e., the first memory cell C7) receives the second read voltage Vread having a relatively high level. Therefore, the first monitoring cell MC0 receives the second monitoring voltage Vm2 having a relatively high level. The relatively high level may be referred to as an elevated value.

In summary, the first monitoring cell MC0 represents at least one weak cell located in the cell string STR0. The level of the monitoring voltage Vm provided to the first monitoring cell MC0 may be adjusted according to a level of a voltage provided to another weak cell in the same cell string STR0. As described above, the level of the monitoring voltage Vm may be higher than the level of the voltage provided to the weak cell (i.e., Vm1>Vr, Vm2>Vread). The application of Vread to C7 when C8 is read tends to leak electrons into the trap layer of C7 because they are neighbors. By imposing a similar even on MC0 when C8 is read, MC0 tends to track the degeneration of the weak cell C7.

Therefore, whether at least one weak cell of the cell string STR0 has deteriorated, for example weak cell C7, can be identified by checking whether the first monitoring cell MC0 has deteriorated, because the trap layer of MC0 has been influenced in a fashion similar to the trap layer of weak cell C7. Thus, it is possible to check whether the first monitoring cell MC0 has deteriorated, which implies that other weak cells of the same cell string have deteriorated, and make a reclaim request based on the checking result. In some embodiments, the neighbor cell, C7, and the monitoring cell MC0, are not in the same cell string.

A check can be performed by writing a 1 to the memory cell (by storing no charge in the trap layer of the exemplary transistor associated with the memory cell). A read of the memory cell being checked is then performed with read voltage Vr (see FIGS. 6 and 15). In a cell which is not deteriorated, the threshold voltage will be lower than Vr. In a deteriorated cell, the threshold voltage will be more than Vr. If the memory cell indicates that a "0" is stored (i.e., the threshold voltage is more than Vr), then the check indicates that the memory cell has deteriorated.

Figure 7:
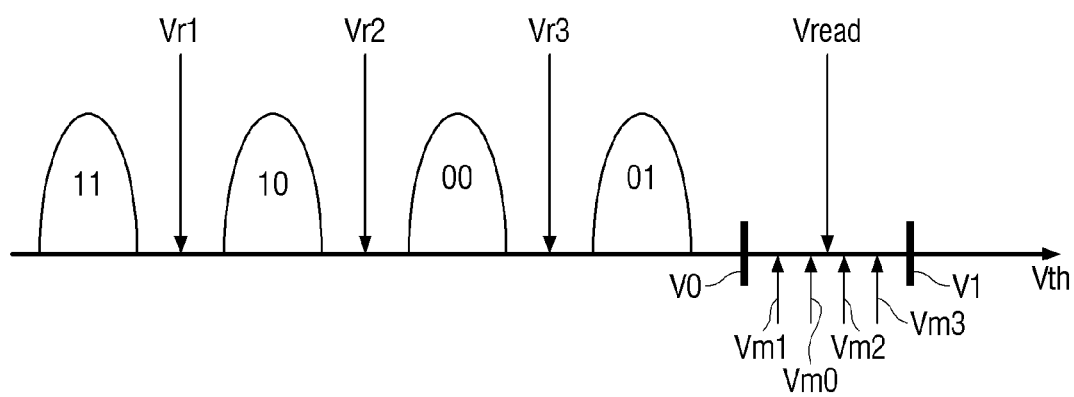
FIG. 7 is a diagram for explaining a method of driving a nonvolatile memory device according to a second embodiment.

FIG. 7 is a diagram for explaining a method of driving a nonvolatile memory device according to a second embodiment. FIG. 7 is a diagram for explaining a level of a monitoring voltage when memory cells are multi-level cells (MLCs). For ease of description, features and aspects not described with reference to FIGS. 4 to 6 will be mainly described below.

Referring to FIG. 7, a read voltage Vr1 is greater than a threshold voltage of a memory cell having data '11' and less than a threshold voltage of a memory cell having data '10.' A read voltage Vr2 is greater than the threshold voltage of the memory cell having the data '10' and less than a threshold voltage of a memory cell having data '00.' A read voltage Vr3 is greater than the threshold voltage of the memory cell having the data '00' and less than a threshold voltage of a memory cell having data '01.' An unselect read voltage Vread is higher than the threshold voltage of the memory cell having the data '01.'

A monitoring voltage Vm is applied to a first monitoring cell MC0 through a monitoring line MWL0. A level of the monitoring voltage Vm applied to the first monitoring cell MC0 may be adjusted according to a memory cell (C0 to Cn) to be read. In other words, the level of the monitoring voltage Vm may be adjusted according to a level of a voltage that a weak cell (e.g., C7) in a cell string receives during a read operation.

During a read operation, when the read voltage Vr1 is applied to the weak cell C7, a monitoring voltage Vm1 may be applied to the first monitoring cell MC0. When the read voltage Vr2 is applied to the weak cell C7, a monitoring voltage Vm0 may be applied to the first monitoring cell MC0. When the read voltage Vr3 is applied to the weak cell C7, a monitoring voltage Vm2 may be applied to the first monitoring cell MC0. When the unselect read voltage Vread is applied to the weak cell C7, a monitoring voltage Vm3 may be applied to the first monitoring cell MC0.

Figure 8:
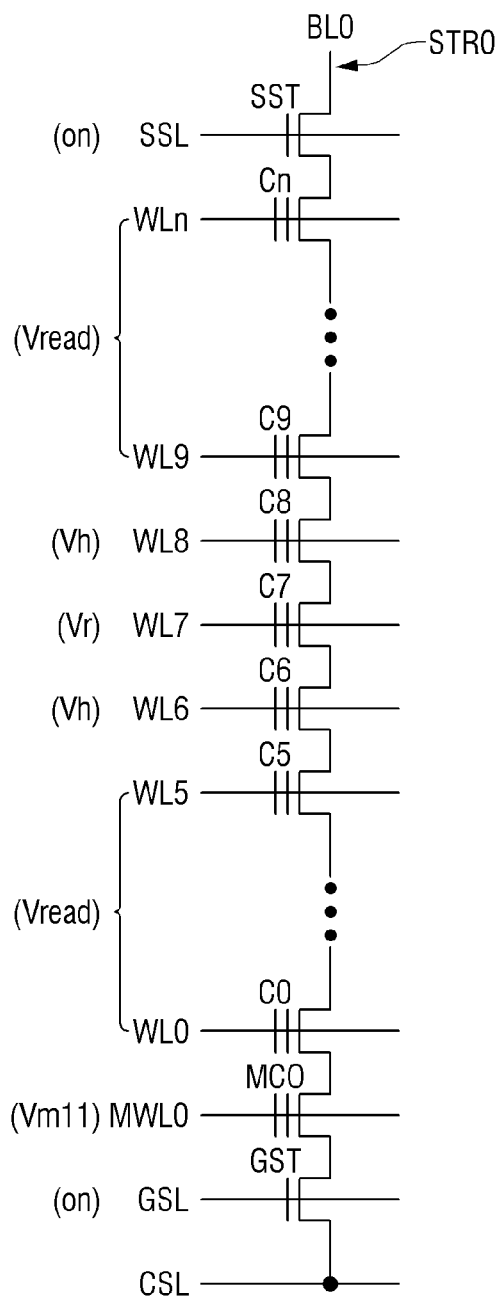
FIGS. 8 and 9 are diagrams for explaining a method of driving a nonvolatile memory device according to a third embodiment.
Figure 9:
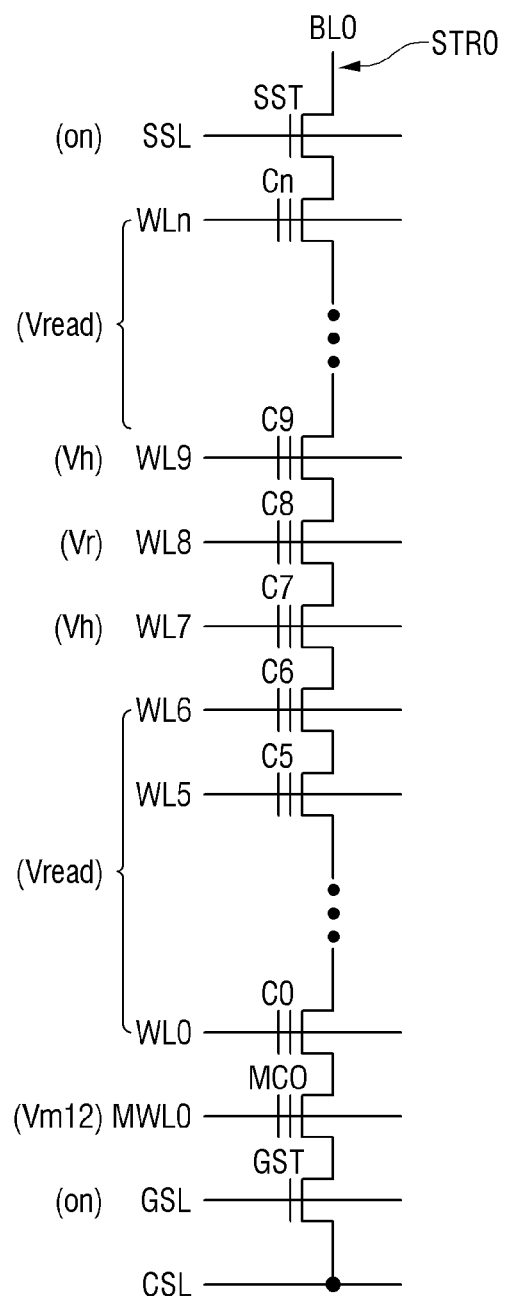
Figure 10:
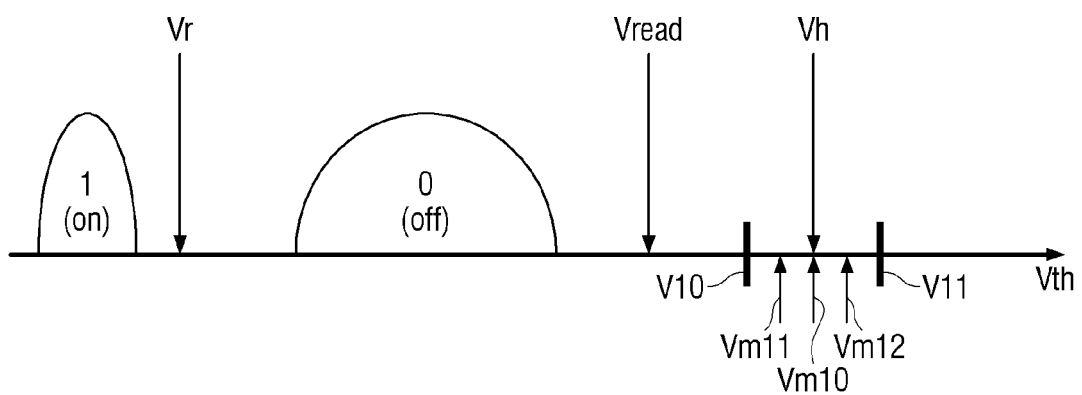
FIG. 10 is a diagram for explaining a level of a monitoring voltage used in the method of driving a nonvolatile memory device of FIGS. 8 and 9.

FIGS. 8 and 9 are diagrams for explaining a method of driving a nonvolatile memory device according to a third embodiment. For ease of description, features and aspects not described with reference to FIGS. 4 to 6 will be mainly described below. FIG. 10 is a diagram for explaining a level of a monitoring voltage used in the method of driving a nonvolatile memory device of FIGS. 8 and 9. In particular, FIG. 10 illustrates the level of the monitoring voltage when memory cells are SLCs.

First, referring to FIG. 8, it is assumed that a first memory cell (e.g., C7) among a plurality of memory cells C0 through Cn is a selected memory cell (i.e., a memory cell to be read). A first read voltage (select read voltage) Vr is provided to the selected first memory cell C7 through a selected word line WL7. A second read voltage (unselect read voltage) Vread is provided to unselected memory cells C0 to C5 and C9 to Cn spaced apart from the first memory cell C7 in a cell string STR0 through unselected word lines WL0 to WL5 and WL9 to WLn. A third read voltage (adjacent unselect read voltage)

Vh is provided to unselected memory cells C6 and C8 adjacent to the selected first memory cell C7 through unselected word lines WL6 and WL8. A third monitoring voltage Vm11 is provided to a first monitoring cell MC0 through a monitoring line MWL0.

Here, referring to FIG. 10, the second read voltage Vread has a higher level than the first read voltage Vr. The third read voltage Vh has a higher level than the second read voltage (unselect read voltage) Vread. The third monitoring voltage Vm11 has a higher level than the second read voltage Vread.

Here, referring to FIG. 9, it is assumed that a second memory cell (e.g., C8) among the memory cells C0 to Cn is a selected memory cell (i.e., a memory cell to be read). The first read voltage (select read voltage) Vr is provided to the selected second memory cell C8 through a selected word line WL8. The second read voltage (unselect read voltage) Vread is provided to unselected memory cells C0 to C6 and C10 to Cn spaced apart from the second memory cell C8 in the cell string STR0 through unselected word lines WL0 to WL6 and WL10 to WLn. The third read voltage (adjacent unselect read voltage) Vh is provided to unselected memory cells C7 and C9 adjacent to the selected second memory cell C8 through unselected word lines WL7 and WL9. A fourth monitoring voltage Vm12 is provided to the first monitoring cell MC0 through the monitoring line MWL0. The fourth monitoring voltage Vm12 has a higher level than the second read voltage Vread.

As described above, the third read voltage Vh higher than the second read voltage Vread is provided to the unselected memory cells C7 and C9 adjacent to the selected memory cell (e.g., C8). The high third read voltage Vh is provided in order to reliably turn on the unselected memory cells C7 and C9 adjacent to the selected memory cell C8 during a read operation. Since the relatively low first read voltage Vr is provided to the selected memory cell C8, the unselected memory cells C7 and C9 adjacent to the selected memory cell C8 may be affected by the first read voltage Vr due to a parasitic capacitor or the like. Therefore, even if the second read voltage Vread is applied to the adjacent unselected memory cells C7 and C9, the adjacent unselected memory cells C7 and C9 are driven with a voltage substantially lower than the second read voltage Vread. This is why the high third read voltage Vh is provided to the unselected memory cells C7 and C9 adjacent to the selected memory cell C8.

When an adjacent unselected memory cell (e.g., C9) is a weak cell, it may be easily deteriorated by the third read voltage Vh.

A level of a monitoring voltage Vm applied to the first monitoring cell MC0 may be adjusted according to a memory cell (C0 to Cn) to be read. More specifically, the level of the monitoring voltage Vm may be adjusted according to whether unselected memory cells (e.g., C7 and C9) immediately adjacent to a memory cell (e.g., C8) to be read are weak cells.

The level of the monitoring voltage Vm may be determined within a second voltage range of V10 to V11 including a second reference voltage Vm10 as illustrated in FIG. 10. Specifically, the second voltage range of V10 to V11 may extend to both sides from the second reference voltage Vm10. Here, a level of the second reference voltage Vm10 is determined based on a level of the third read voltage Vh. For example, the level of the second reference voltage Vm10 and the level of the third read voltage Vh may be substantially equal.

When adjacent unselected memory cells (e.g., C6 and C8) are not weak cells as in FIG. 8, the first monitoring cell MC0 receives the relatively low third monitoring voltage Vm11 within the second voltage range of V10 to V11.

On the other hand, when an adjacent unselected memory cell (e.g., C9) is a weak cell as in FIG. 9, the weak cell C9 receives the considerably high third read voltage Vh. Therefore, the first monitoring cell MC0 receives the fourth monitoring voltage Vm12 having a high level within the second voltage range of V10 to V11.

In summary, the first monitoring cell MC0 represents at least one weak cell located in the cell string STR0. The level of the monitoring voltage Vm provided to the first monitoring cell MC0 may be adjusted according to a level of a voltage provided to a weak cell. Therefore, whether at least one weak cell of the cell string STR0 has deteriorated can be identified only by checking whether the first monitoring cell MC0 has deteriorated. Thus, it is possible to check whether the first monitoring cell MC0 has deteriorated and make a reclaim request based on the checking result.

Figure 11:
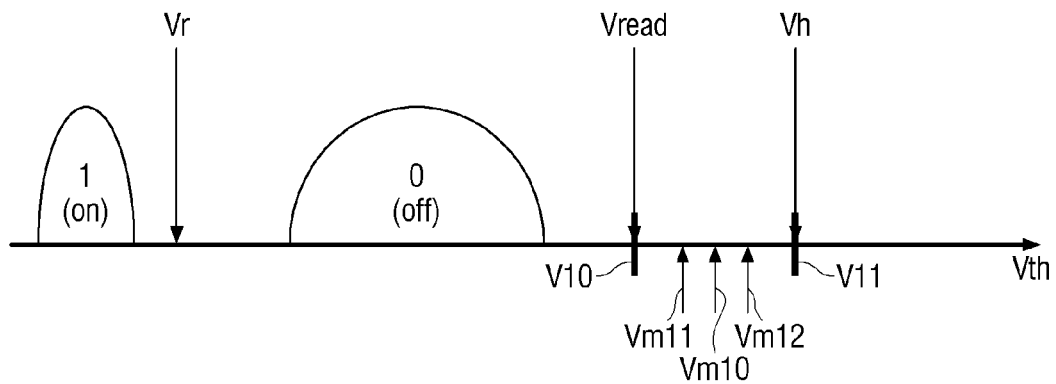
FIG. 11 is a diagram for explaining a method of driving a nonvolatile memory device according to a fourth embodiment.

FIG. 11 is a diagram for explaining a method of driving a nonvolatile memory device according to a fourth embodiment. For ease of description, features and aspects not described with reference to FIG. 10 will be mainly described below.

Referring to FIG. 11, a level of a monitoring voltage Vm may be determined within a second voltage range of V10 to V11 including a second reference voltage Vm10. Specifically, the second voltage range of V10 to V11 may extend to both sides from the second reference voltage Vm10. Here, a level of the second reference voltage Vm10 is determined based on a level of a third read voltage Vh. For example, the level of the second reference voltage Vm10 may be determined to be an average value of a second read voltage Vread and the third read voltage Vh, but embodiments are not limited to this case.

In FIG. 11, a lower limit V10 of the second voltage range of V10 to V11 is equal to the second read voltage Vread, and an upper limit V11 is equal to the third read voltage Vh, but embodiments are not limited to this case.

Figure 12:
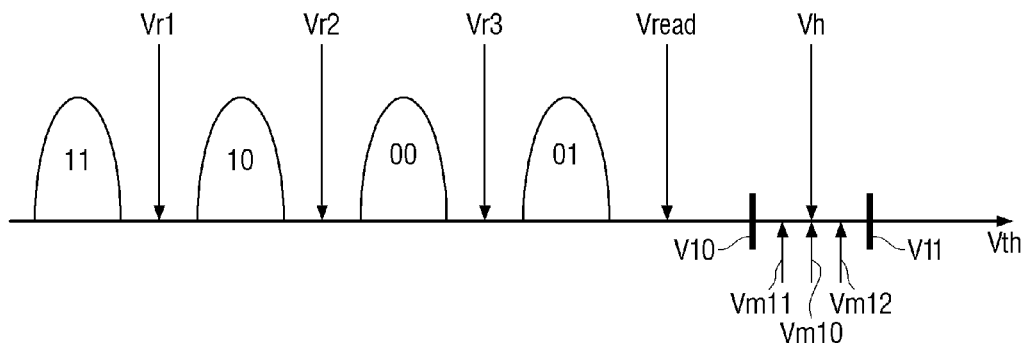
FIG. 12 is a diagram for explaining a method of driving a nonvolatile memory device according to a fifth embodiment.

FIG. 12 is a diagram for explaining a method of driving a nonvolatile memory device according to a fifth embodiment. FIG. 12 is a diagram for explaining a level of a monitoring voltage when memory cells are MLCs. For ease of description, features and aspects not described with reference to FIGS. 8 to 11 will be mainly described below.

Referring to FIG. 12, a read voltage Vr1 is greater than a threshold voltage of a memory cell having data '11' and less than a threshold voltage of a memory cell having data '10.' A read voltage Vr2 is greater than the threshold voltage of the memory cell having the data '10' and less than a threshold voltage of a memory cell having data '00.' A read voltage Vr3 is greater than the threshold voltage of the memory cell having the data '00' and less than a threshold voltage of a memory cell having data '01.' An unselect read voltage Vread is higher than the threshold voltage of the memory cell having the data '01.'

A monitoring voltage Vm is applied to a first monitoring cell MC0 through a monitoring line MWL0. A level of the monitoring voltage Vm applied to the first monitoring cell MC0 may be adjusted according to whether unselected memory cells (e.g., C7 and C9) adjacent to a memory cell (e.g., C8) to be read are weak cells.

During a read operation, when the adjacent unselected memory cells (e.g., C7 and C9) to which a third read voltage Vh is applied are weak cells, a relatively high fourth monitoring voltage Vm12 is applied. When all of the adjacent unselected memory cells (e.g., C7 and C9) to which the third read voltage Vh is applied are not weak cells, a relatively low third monitoring voltage Vm11 is applied.

Figure 13:
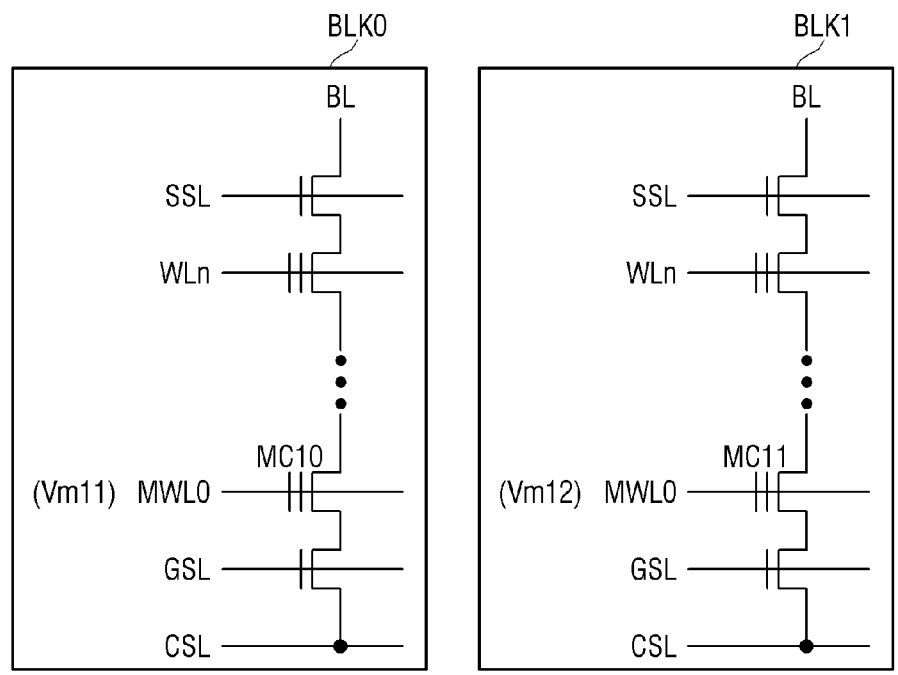
FIG. 13 is a diagram for explaining a method of driving a nonvolatile memory device according to a sixth embodiment.

FIG. 13 is a diagram for explaining a method of driving a nonvolatile memory device according to a sixth embodiment.

Referring to FIG. 13, a level of a monitoring voltage Vm may be adjusted according to characteristics of a memory block including a memory cell to be read.

Specifically, the nonvolatile memory device includes a first memory block BLK0 and a second memory block BLK1. A first cell string is located in the first memory block BLK0 and includes a plurality of memory cells and a first monitoring cell MC10. A second cell string is located in a second memory block BLK1 and includes a plurality of memory cells and a second monitoring cell MC11. A monitoring voltage (e.g., Vm11) provided to the first monitoring cell MC10 and a monitoring voltage (e.g., Vm12) provided to the second monitoring cell MC11 may be different from each other.

For example, when the second memory block BLK1 is a weak block, the monitoring voltage Vm12 provided to the second monitoring cell MC11 may be relatively high by reflecting this. On the other hand, when the first memory block BLK0 is not a weak block, the monitoring voltage Vm11 provided to the first monitoring cell MC10 may be relatively low by reflecting this.

Figure 14:
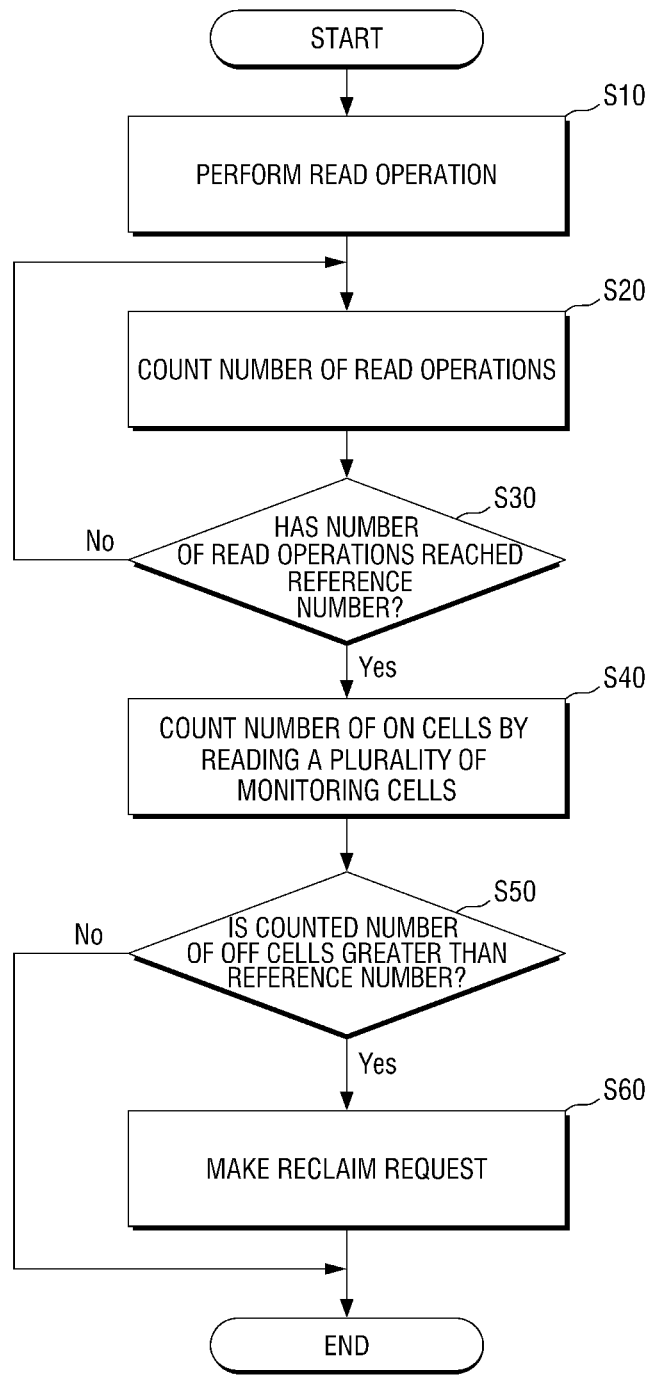
FIG. 14 is a flowchart illustrating a method of driving a nonvolatile memory device according to a seventh embodiment.
Figure 15:
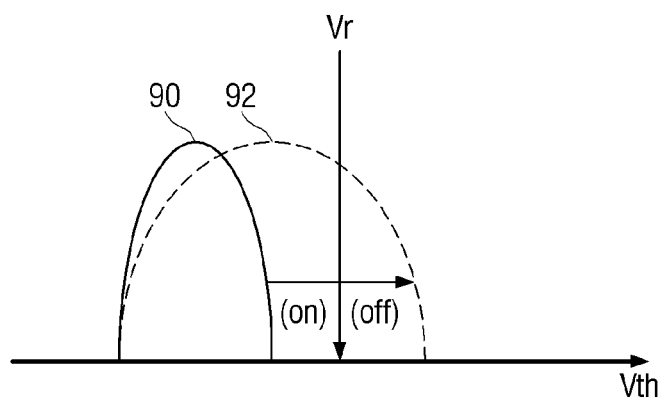
FIG. 15 illustrates a process in which threshold voltages of a plurality of monitoring cells change.

FIG. 14 is a diagram illustrating a method of driving a nonvolatile memory device according to a seventh embodiment. FIG. 15 illustrates a process in which threshold voltages of a plurality of monitoring cells change.

Referring to FIG. 14, a read operation is performed S10.

For example, when a first memory cell is read, a first read voltage Vr is provided to the first memory cell, a second read voltage Vread is provided to a memory cell spaced apart from the first memory cell, a third read voltage Vh is provided to an unselected memory cell adjacent to the first memory cell, and a first monitoring voltage is provided to a monitoring cell.

When a second memory cell different from the first memory cell is read, the first read voltage Vr is provided to the second memory cell, the second read voltage Vread is provided to a memory cell spaced apart from the second memory cell, the third read voltage Vh is provided to an unselected memory cell adjacent to the second memory cell, and a second monitoring voltage different from the first monitoring voltage is provided to the monitoring cell.

As described above, when an adjacent memory cell which receives the third read voltage Vh is a weak cell, a relatively high monitoring voltage is provided to the monitoring cell. When the adjacent memory cell which receives the third read voltage Vh is not a weak cell, a relatively low monitoring voltage is provided to the monitoring cell.

The number of read operations performed on a cell string is counted S20. That is, the number of read operations performed on each of a plurality of memory cells included in the cell string is counted.

It is checked whether the counted number of read operations has reached a reference number S30.

When the counted number of read operations reaches the reference number, the number of on cells or off cells is counted by reading a plurality of monitoring cells connected to a monitoring line S40. Based on the counted number of on cells or off cells, it is determined whether the monitoring cell has deteriorated.

Referring to FIG. 15, thresholds of the monitoring cells connected to the monitoring line may be lower than the first read voltage Vr before a read operation is performed. That is, a threshold voltage distribution 90 may be lower than the first read voltage Vr.

As the read operation is repeated, the monitoring cells are soft-programmed. An example of the mechanism of soft-programming is that the pass voltage applied to an unselected cell during read events causes electrons to be introduced little by little into the trap layer. Therefore, the threshold voltages of the monitoring cells gradually increase. That is, the threshold voltage distribution 92 gradually moves to the right. Consequently, the threshold voltages of some monitoring cells become higher than the first read voltage Vr. The number of on cells may gradually decrease, and the number of off cells may gradually increase.

For example, when the counted number of off cells is equal to or greater than a reference number S50, a reclaim request is made S60. Conversely, when the counted number of on cells is equal to or less than the reference number, the reclaim request is made.

When the counted number of off cells is equal to or less than the reference number S50, the reclaim request is not made. Conversely, when the counted number of on cells is equal to or greater than the reference number, the reclaim request is not made.

Figure 16:
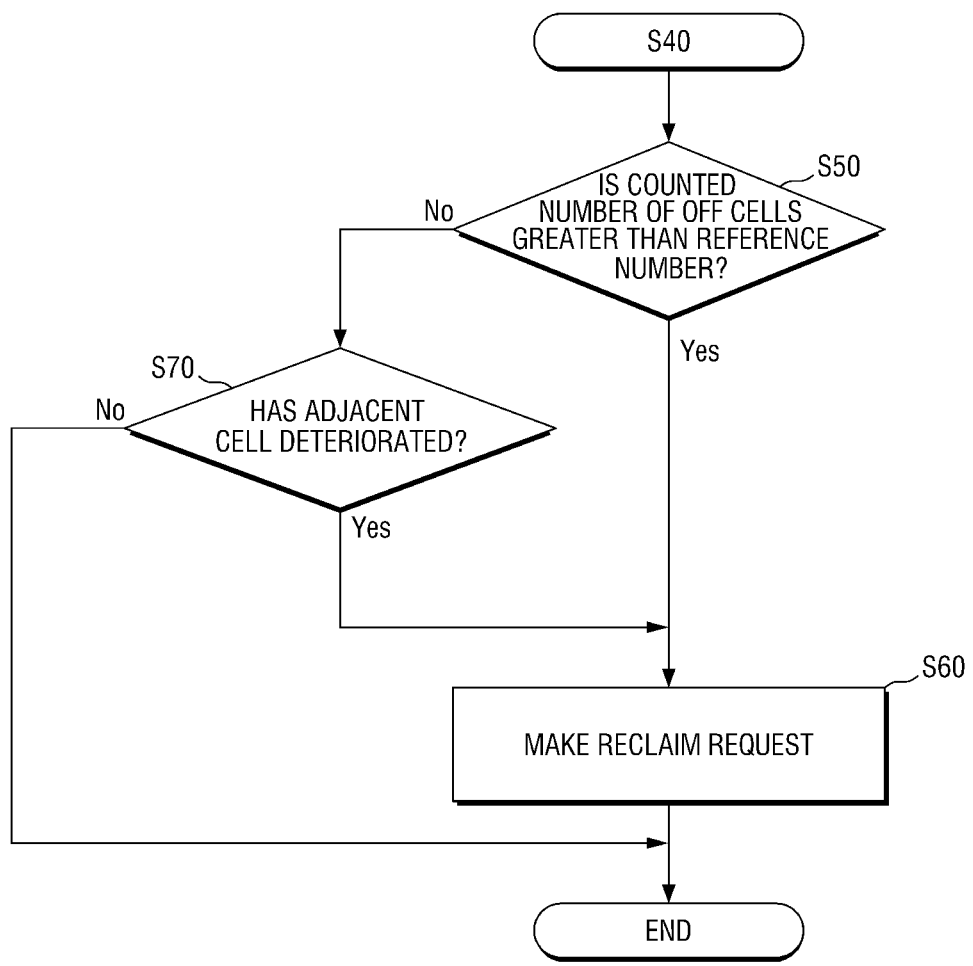
FIG. 16 is a flowchart illustrating a method of driving a nonvolatile memory device according to an eighth embodiment.

FIG. 16 is a diagram illustrating a method of driving a nonvolatile memory device according to an eighth embodiment.

Whether to make a reclaim request may be determined not only by counting the number of on cells/off cells but also by checking whether an adjacent unselected memory cell has deteriorated.

Specifically, referring to FIG. 16, even when the counted number of off cells is equal to or less than a reference number S50, it is checked whether an unselected memory cell adjacent to a memory cell that is read last has deteriorated S70. That is, if the memory cell that is read last is C7, it is checked whether C6 and C8 have deteriorated. This is because adjacent unselected memory cells which receive a third read voltage Vh having a high level can be easily deteriorated as described above.

When it is determined that the adjacent unselected memory cell has deteriorated, a reclaim request is made S60.

When it is determined that the adjacent unselected memory cell has not deteriorated, the reclaim request is not made.

While the disclosure has been particularly shown and described with reference to exemplary embodiments thereof, it will be understood by those of ordinary skill in the art that various changes in form and detail may be made therein without departing from the spirit and scope of the disclosure as defined by the following claims. Therefore, the exemplary embodiments described above should be considered in a descriptive sense only and not for purposes of limitation.

What is claimed is:
1. A nonvolatile memory device comprising:
a memory cell array comprising a first cell string comprising a plurality of memory cells connected in series, and wherein the plurality of memory cells includes a first monitoring cell, a first memory cell, and a second memory cell; and
a row decoder configured to:
provide a first read voltage to the first memory cell and a first monitoring voltage to the first monitoring cell when reading the first memory cell; and
provide the first read voltage to the second memory cell and a second monitoring voltage different from the first monitoring voltage to the first monitoring cell when reading the second memory cell, wherein the first monitoring voltage is configured to apply an elevated voltage to the first monitoring cell, and the second memory cell is a weak cell, wherein the elevated voltage is configured to cause some electrons to leak into a trap layer of the first monitoring cell and the elevated voltage is further configured to cause the first monitoring cell to track a degeneration of the second memory cell.

2. The nonvolatile memory device of claim 1, wherein the first monitoring voltage or the second monitoring voltage is higher than the first read voltage.

3. The nonvolatile memory device of claim 1, wherein the row decoder is further configured to, when reading the first memory cell or reading the second memory cell, provide a second read voltage to unselected memory cells among the plurality of memory cells, and wherein the second read voltage is higher than the first read voltage.

4. The nonvolatile memory device of claim 3, wherein the first monitoring voltage or the second monitoring voltage is determined within a first voltage range comprising a first reference voltage, and a level of the first reference voltage is determined based on a level of the second read voltage.

5. The nonvolatile memory device of claim 1, wherein the row decoder is further configured to:

when reading the first memory cell or the second memory cell among the plurality of memory cells, provide a second read voltage to an unselected memory cell spaced apart from the first memory cell or the second memory cell, and provide a third read voltage to an unselected memory cell adjacent to the first memory cell or the second memory cell, and wherein the third read voltage is higher than the second read voltage.

6. The nonvolatile memory device of claim 5, wherein the row decoder is further configured to adjust the first monitoring voltage or the second monitoring voltage within a second voltage range, the second voltage range comprising a second reference voltage, and wherein a level of the second reference voltage is determined based on a level of the third read voltage.

7. The nonvolatile memory device of claim 1, wherein the memory cell array further comprises:

a first memory block; and
a second memory block, wherein the first cell string is located in the first memory block, a second cell string is located in the second memory block, wherein the second cell string comprises a second monitoring cell and a third memory cell, wherein the row decoder is further configured to provide, when reading the third memory cell, the first read voltage to the third memory cell and a third monitoring voltage to the second monitoring cell, and wherein the third monitoring voltage is different from the first monitoring voltage.

8. The nonvolatile memory device of claim 1, further comprising a reclaim controller, wherein the reclaim controller is configured to:

check whether the first monitoring cell has deteriorated; and
make a reclaim request based on a result of the check.

9. The nonvolatile memory device of claim 8, wherein in the reclaim controller is further configured to check by counting, wherein the counting is performed by reading a plurality of first monitoring cells connected to a monitoring line, a first number of on cells or a second number of off cells, and wherein the check is based on the first number or the second number.

10. The nonvolatile memory device of claim 8, wherein the reclaim controller is further configured to check by operations including:

counting a third number of read operations performed on the first cell string; and
compare the third number with a reference number.

11. The nonvolatile memory device of claim 10, wherein when the third number of read operations reaches the reference number, the reclaim controller is further configured to check whether an unselected memory cell adjacent to a memory cell that is read last has deteriorated.

12. The nonvolatile memory device of claim 1, wherein the first cell string further comprises a string select element and a ground select element, the plurality of memory cells is connected in series between the string select element and the ground select element, the plurality of memory cells includes a second plurality of memory cells and the first monitoring cell is located between the string select element and the second plurality of memory cells or located between the ground select element and the second plurality of memory cells.

13. The nonvolatile memory device of claim 1, wherein the elevated voltage is configured so that a soft-programming condition of the first monitoring cell tracks the degeneration of the second memory cell.

14. The nonvolatile memory device of claim 13, further comprising a reclaim controller, wherein the reclaim controller is configured to:

determine that the first monitoring cell has deteriorated; and
store a data value from the second memory cell in a second cell string, wherein the second cell string is different than the first cell string.

15. The nonvolatile memory device of claim 1, wherein the second memory cell is identified as a weak cell through a test conducted during a manufacture of the nonvolatile memory device.

16. The nonvolatile memory device of claim 1, wherein position of the weak cell is stored in the nonvolatile memory device.

17. A nonvolatile memory device comprising:

a memory cell array comprising a first cell string comprising a plurality of memory cells connected in series, and wherein the plurality of memory cells includes a first monitoring cell, a first memory cell, and a second memory cell; and a row decoder configured to:

provide a first read voltage to the first memory cell and a first monitoring voltage to the first monitoring cell when reading the first memory cell; and provide the first read voltage to the second memory cell and a second monitoring voltage different from the first monitoring voltage to the first monitoring cell when reading the second memory cell, wherein the row decoder is further configured to:

when reading the first memory cell or the second memory cell among the plurality of memory cells, provide a second read voltage to an unselected memory cell spaced apart from the first memory cell or the second memory cell, and provide a third read voltage to an unselected memory cell adjacent to the first memory cell or the second memory cell, and wherein the third read voltage is higher than the second read voltage, and wherein the row decoder is further configured to adjust a level of the first monitoring voltage when the unselected memory cell adjacent to the first memory cell is a weak cell.

18. A nonvolatile memory device comprising:

a memory cell array comprising a cell string, the cell string comprising a first memory cell, a plurality of memory cells connected in series, a monitoring cell, a string select element, and a ground select element, wherein the monitoring cell is located between the string select element and the plurality of memory cells or between the ground select element and the plurality of memory cells, and the cell string comprising a selected memory cell and unselected memory cells, and wherein the plurality of memory cells comprises the first memory cell and the first memory cell is the selected memory cell; and a row decoder configured to:

provide voltages to the plurality of memory cells, the monitoring cell, the string select element, and the ground select element;

provide, when reading the first memory cell, a first read voltage to the first memory cell, a second read voltage to a first unselected memory cell spaced apart from the first memory cell, a third read voltage to an unselected memory cell adjacent to the first memory cell and a first monitoring voltage to the monitoring cell; and provide, when reading a second memory cell, the first read voltage to the second memory cell, the second read voltage to a second unselected memory cell spaced apart from the second memory cell, the third read voltage to a third unselected memory cell adjacent to the second memory cell and a second monitoring voltage different from the first monitoring voltage to the monitoring cell, wherein the third read voltage is greater than the second read voltage, the second read voltage is greater than the first read voltage, the first monitoring voltage and the second monitoring voltage are greater than the second read voltage, wherein the nonvolatile memory device is configured to determine whether to make a reclaim request based on whether the monitoring cell is deteriorated.

19. A method for memory cell deterioration detection, the method comprising:

identifying a first weak cell in a cell string;

identifying a non-weak cell in the cell string, wherein the non-weak cell is a neighbor to the first weak cell in the cell string;

identifying a second weak cell in the cell string;

designating the second weak cell as a monitoring cell;

when a first read operation reads the non-weak cell:
applying an elevated pass voltage to the monitoring cell based on the first read operation of reading the non-weak cell;

when a second read operation reads the first weak cell:
applying a non-elevated pass voltage to the monitoring cell based on the second read operation of reading the first weak cell;

when based on a count of read operations exceeds exceeding a threshold, checking the monitoring cell for deterioration; and based on a result of the checking, when the monitoring cell has deteriorated, performing a reclaim operation of the cell string; and based on the result of the checking, when the monitoring cell has not deteriorated, not performing the reclaim operation of the cell string.

* * * * *